(12) United States Patent
Guo

(10) Patent No.: US 8,466,745 B2
(45) Date of Patent: Jun. 18, 2013

(54) HYBRID RECONFIGURABLE MULTI-BANDS MULTI-MODES POWER AMPLIFIER MODULE

(76) Inventor: Yaohui Guo, Lexington, MA (US)

( * ) Notice: Subject to any disclaimer, the term of this patent is extended or adjusted under 35 U.S.C. 154(b) by 37 days.

(21) Appl. No.: 13/214,229

(22) Filed: Aug. 21, 2011

(65) Prior Publication Data

US 2012/0075023 A1    Mar. 29, 2012

Related U.S. Application Data

(60) Provisional application No. 61/376,753, filed on Aug. 25, 2010.

(51) Int. Cl.
*H03G 3/10*  (2006.01)

(52) U.S. Cl.
USPC .......................................... 330/285; 330/302

(58) Field of Classification Search
USPC .......................................... 330/302, 285, 296
See application file for complete search history.

(56) References Cited

U.S. PATENT DOCUMENTS

| 6,603,351 | B2 * | 8/2003 | Suzuki ........................... 330/133 |
| 7,443,236 | B2 * | 10/2008 | Dow et al. ........................ 330/51 |
| 7,501,897 | B2 * | 3/2009 | Mori et al. ..................... 330/302 |
| 7,567,128 | B2 * | 7/2009 | Oka et al. ....................... 330/302 |
| 7,733,187 | B2 * | 6/2010 | Tateoka et al. ................. 330/302 |
| 7,944,291 | B2 * | 5/2011 | Jung et al. ........................ 330/51 |
| 7,952,433 | B2 * | 5/2011 | An et al. ........................ 330/295 |
| 8,072,272 | B2 * | 12/2011 | Zhao et al. ..................... 330/310 |

* cited by examiner

*Primary Examiner* — Henry Choe

(57) ABSTRACT

The present invention provides a single chain power amplifier for a multi-mode and/or multi band wireless communication. The power amplifier comprise switchable input, inter-stage and output matching networks as well as active periphery adjustable driver stage power device and power stage power device. Switches and bias are configured for each frequency band and/or wireless communication standard. A driver stage power device, switches, control and bias circuitry, input matching, inter-stage matching and a part of output matching is fabricated on CMOS Silicon On Insulator process (SOI), while a power stage power device maybe fabricated by Gallium Arsenide (GaAs) processing.

20 Claims, 3 Drawing Sheets

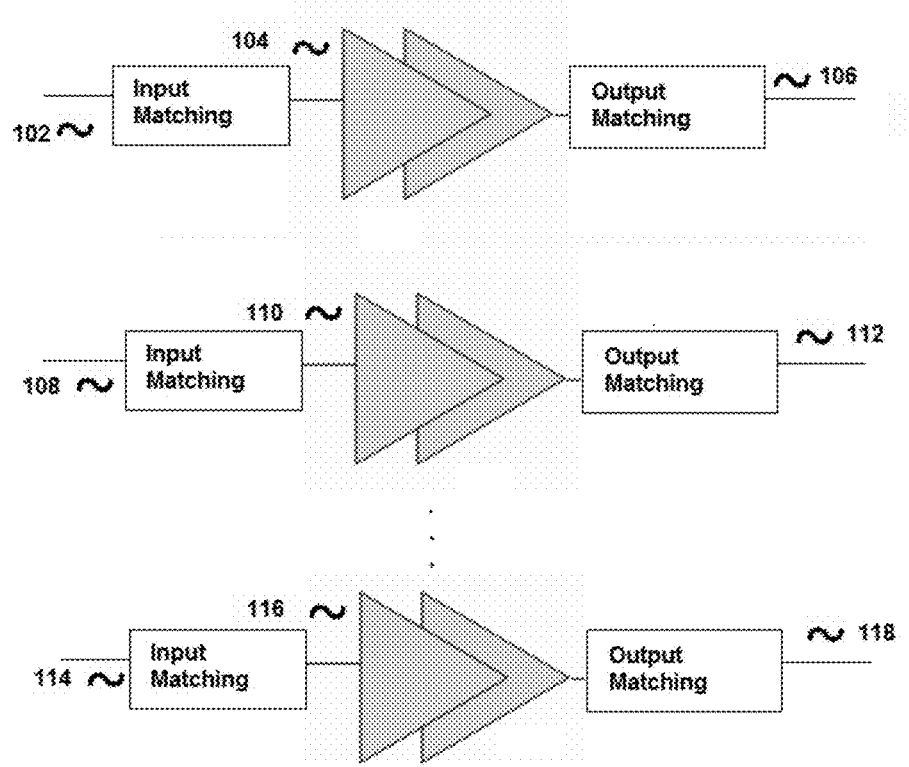

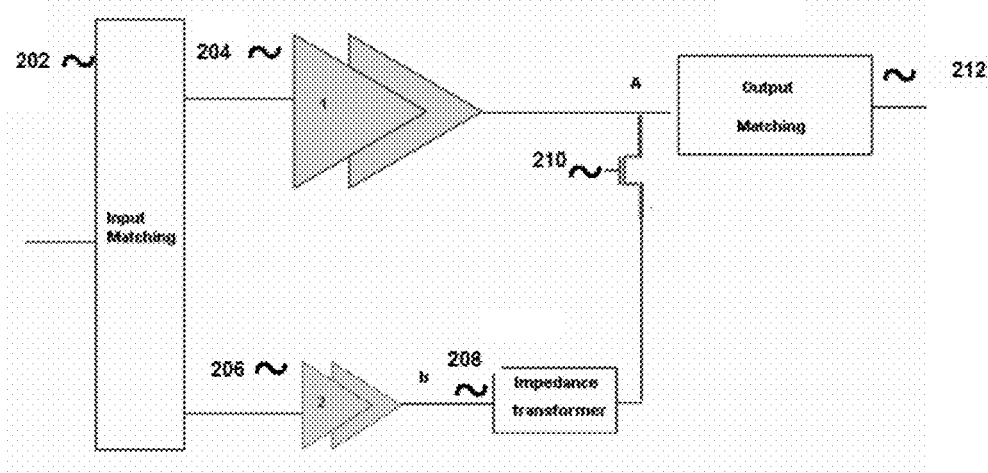
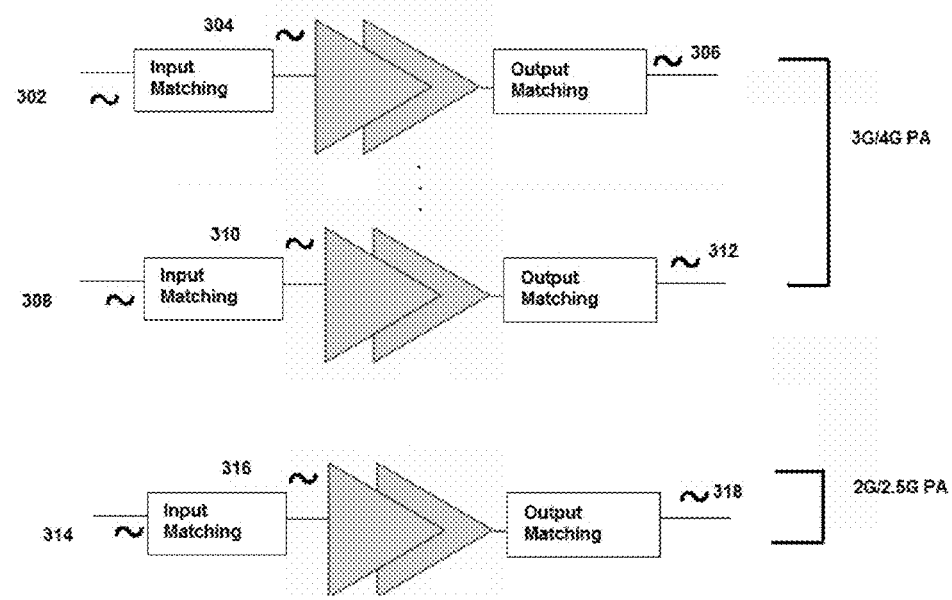

HYBRID RECONFIGURABLE MULTI-BANDS MULTI-MODES POWER AMPLIFIER MODULE

RELATED APPLICATIONS

This application claims the benefit of priority under 35 U.S.C. §119(e) of U.S. Provisional Patent Application No. 61/376,753, filed Aug. 25, 2010, and entitled "HYBRID RECONFIGURABLE MULTI-BANDS MULTI-MODES POWER AMPLIFIER", the disclosure of which is hereby incorporated by reference in its entirety.

BACKGROUND

1. Field of Invention

The present invention relates generally to a RF power amplifier ("PA") integrated circuits ("ICs"), and more particularly, to a power amplifier for use in multi-mode and multi-band wireless communication devices.

2. Discussion of Related Art

Multi-band and Multi-mode power amplifiers have been proposed to address an increasing demand for bandwidth enhancement and flexibility of wireless communication system. To achieve higher data rate, more complicated modulations are adopted, which push wireless system evolution from the second generation ("2G") to the third generation ("3G") including three international standards: time division synchronous code division multiple access ("TD-SCDMA"), wide-band code division multiple access/high-speed packet access ("WCDMA/HSPA"), and code division multiple access ("CDMA") 2000. The frequency bands in 3 G wireless system vary from one area to another. To support global user roaming and global phone design, multi-band RF power amplifiers are required. To support backward compliance with 2G legacy network infrastructure, multi-modes for 3G and 2G need to be supported.

In wireless transmitter system, power amplifiers are often tuned for the frequency and power level of intended operation. In principle, a combination of device size, bias and matching circuits can be optimized for fixed output power, frequency with given process technology. If either frequency or output power is changed, matching network, bias and device size need to be adjusted for optimum performance.

Unfortunately, the adjustability has not been supported by current power amplifier architecture. Various design architecture have been disclosed in the art that expand single band or single mode functionality to multi-band and multi-mode applications. For example, U.S. Pat. No. 5,060,294 to Schwent et al, describes a dual-mode power amplifier. A dual mode power amplifier is an amplifier operating in one of two different modes in a single frequency band. Such an amplifier, however, is not a capable of operating in more than one frequency band.

U.S. Pat. No. 6,970,040 to David Dening describes a wide-band power amplifier with multiple inputs and multiple matching circuits that operate to combine the signals in the different frequency bands. In the architecture, each of the matching circuits has to be small impedance in the corresponding one of the plurality of frequency band and large impedance in others of the plurality of frequency bands. However, when frequencies bands are close each other or more than three bands are needed, this architecture will suffers bigger size as well as high loss due to limited quality factor of inductor or capacitors.

Currently, the discrete power amplifier solution is widely used in multi-band and multi mode phones, where parallel multi PA device set are used and one PA device set for a frequency band as shown in FIG. 1. Another solution is used to deal with power level changes as shown in FIG. 2. This solution has good power added efficiency ("PAE") at one path and worse PAE at another path, which is not tolerable in a lot of multi-bands 3G applications. A multi-modes converged power amplifier is shown in FIG. 3, where multiple paths are used for 3G, Long Term Evolution ("L TE") and 2G, separately. These three approaches all use parallel have much bigger size and high cost as well as complexity for routing in phone board designs.

It would be highly desirable to have a multi-band and multi mode power amplifier design that can cover wide frequency range and minimizes size and cost. It is therefore an object of the invention to provide a reconfigurable architecture with CMOS Silicon On Insulator ("SOI") and Gallium Arsenide ("GaAs") hybrid integration.

SUMMARY OF INVENTION

One aspect of the present invention is a RF PA that amplifiers a RF signal in a selectable plurality of frequency bands and wireless standards. The RF PA is fabricated such that during operation in a frequency band, a driver stage power device amplifiers the signal first, while a distinct power stage power device subsequently provides final amplification of the signal. The RF PA may be further defined by requiring any combination of the following additional features insofar as they are functionally compatible. The additional features may include the driver stage power device may be required to be fabricated on a SOI integrated circuit die; and/or the power stage power device may be required to be fabricated on a GaAs die; and/or the RF PA may require to assemble the driver stage power device and power stage power device on a multiple layer laminates; and/or the RF PA may comprise switches in an input matching network, and/or inter-stage matching networks, and/or output matching networks; and/or each switch may comprise one or multiple Stacked Field-Effect transistor ("FET"); and/or each switch may be required to connect a serial capacitor; and/or switches and corresponding serial capacitors may be required to be fabricated on a SOI die; and/or the power stage power device may consists of parallel cells, which may connect a serial capacitor and biased with separate trace from bias control block; and/or the driver stage power device may consists of parallel cells, which is biased, with separate trace from bias control block; and/or bias and control circuitry may be further required to be in the same die with the driver power device; and/or all switches, driver stage power device, bias and control circuitry may be required to be FETs having an insulated gate; and/or the RF PA may be required to consist substrate; and/or a part of the RF PA may be required to be implemented in SOI material; and or a part of RF PA may be required to comprise of a solitary, or alternatively of at least one, silicon on sapphire semiconductor die.

Another aspect of the present invention is a method of providing amplification at plural frequency band and/or wireless standards. In a frequency band and a wireless standard, the presented disclosure includes steps of processing the signal first through a input matching network, then amplifying the signal by a driver stage power device amplifying circuit device, after that reshaping the signal with an inter-stage matching networks, then proving the signal thus amplified to an input of a power stage power device amplifying circuit device for final amplification, and then output the signal through an output matching network. This method may be further defined by requiring any combination of the following features and steps, insofar as they are functionally compatible, including the following: a combination of on/off status of switches in the input matching network may be required to be configured for given frequency and wireless standard; and/or a combination of on/off status of switches in the inter-stage matching network may be required to be configured for given frequency and wireless standard; and/or a combination of on/off status of switches in the output matching network may be required to be configured for given frequency and wireless standard; and/or a combination of bias voltage or current in power cells of the driver stage power device may be required to be configured for given frequency and wireless standard; and/or a combination of voltage or current in power cells of the power stage power device may be required to be configured for given frequency and wireless standard; and/or a combination of on/off status of power cells of the driver stage power device may be required to be configured for given frequency and wireless standard; and/or a combination of on/off status of power cells of the power stage power device may be required to be configured for given frequency and wireless standard.

According to one embodiment, the power stage power device for the final amplification is fabricated in GaAs integrated circuit die. The driver stage power device, bias and control circuitry, switches and a part of matching networks are fabricated on a SOI integrated circuit die. The RF PA is assembled the driver stage power device and power stage power device on a multiple layer laminates. RF PA comprises switches in an input matching network, inter-stage matching networks, and output matching networks, where each switch comprises one or multiple stacked FET and connects a serial capacitor. The power stage power device consists of parallel cells, which connects a serial capacitor and is biased with a separate trace from a bias control block. The driver stage power device consists of parallel cells, which is biased, with a separate trace from a bias control block.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein," and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

FIG. 1 is a schematic representation of discrete architecture of power amplifier for multi-band applications;

FIG. 2 is a is a schematic representation of discrete architecture of power amplifier for standards requiring different output power levels;

FIG. 3 is a schematic representation of discrete architecture of power amplifier for multi-mode applications;

DETAILED DESCRIPTION

The embodiments set forth below represent the necessary information to enable those skilled in the art to practice the invention and illustrate the best mode of practicing the invention. Upon reading the following description in light of the accompanying drawing figures, these skilled in the art will understand the concepts of the invention and will recognize applications of these concepts not particularly addressed herein. It should be understood that these concepts and applications fall within the scope of the disclosure and the accompanying claims.

Embodiments of RF PAs as described herein may generally be fabricated using any number of alternative semiconductor materials and manufacturing processes, as will be appreciated by those who are knowledgeable and experienced in respect of such alternative semiconductors and processes. However, the preferred embodiments have been developed in accordance with SOI semiconductor, and corresponding processing steps, because that is the semiconductor type with the inventors presently work most often. Only reasonable experimentation will be required to adapt the structures and methods described herein for such alternative semiconductor types and processes. Hence, such alternative embodiments are fairly taught by the description set forth below, and are encompassed by any statement or claim that defines the invention without explicitly excluding or rendering such alternative embodiments incompatible.

It is highly desirable for an RF PA to maintain small size, high efficiency and high linearity for multi-band and multi-mode applications. At least some radio communications, such WCDMA have multi bands word-widely and needs backward-compatible for existing 2G wireless communication standards. An embodiment of an RF PA described herein operates in multiple frequency bands and both 3G and 2G wireless communication standards.

Discrete architecture in existing plural power amplifiers have resulted in bulky size, high cost and design complexity because it uses multiple parallel discrete power amplifiers to support multiple frequency bands and multiple wireless standards, where one power amplifier is dedicated for one band or mode. This has resulted in doubled or tripled cost and size raise.

To shrink size and reduce cost, highly integration is adopting to put mode power amplifier in a single package. Consequently, the overall size is reduced with 30-40%, but the cost is still high, as multiple devices are used.

Figure 4:
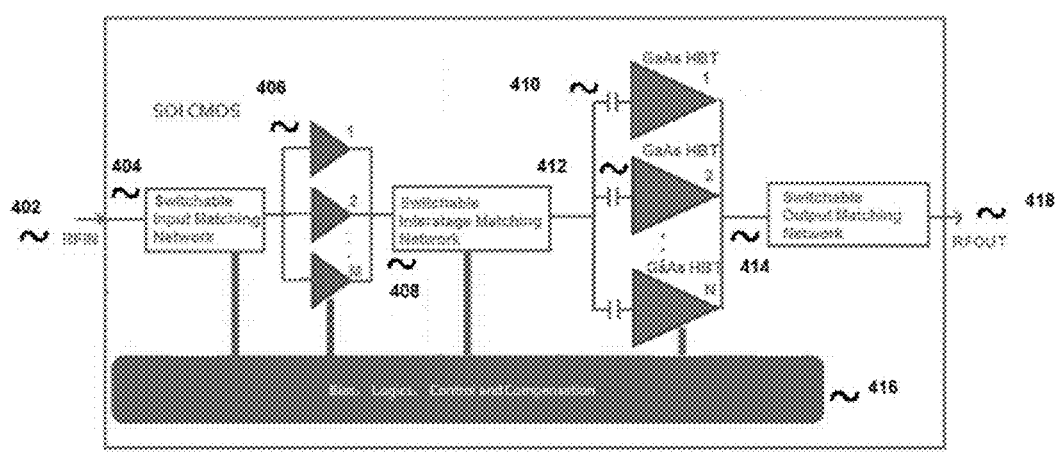
FIG. 4 is a schematic representation of power amplifier circuitry configured according to one embodiment of the present invention for multi-band and multi-mode applications.

FIG. 4 illustrates architecture for an exemplary embodiment of the RF PA 400. The RF input signal at the input node RFIN 402 is coupled into a switchable input matching network block 404. From there it is coupled to the driver stage power device 406. The output of block 404 is substantially coupled into power stage power device 412 though capacitor array 410. And then amplified signal is delivered to the output node RFOUT 418.

It is notable that the design set forth here only has one signal path from the input node to the output node. Also, here is only one power device set which consists of driver stage power devices and power stage power device. This one power device set is reused among different frequency bands and difference wireless communication standards.

Bias, logics, control and compensation block 416 control bias current and status of switches of block 404, 406, 408, 412 and 414 as well as receiving information from digital interface, which is connected with RF transceiver and/or baseband integrated circuits.

A digital interface is a part 416, which may receive information reflecting operation states, such as frequency band and wireless standards. The information may be received partly or wholly as serial data in order to minimize connections. The mechanism by which the operational information is translated to particular bias values, such as a lookup table, may be adjusted during fabrication or testing to compensate for manufacturing process variations. It may also be made variable depending upon value such as supply voltage and temperatures.

Block 406 consists of an array of power device cells. Each cell has individual bias trace from block 416 and can be feed with different bias voltage and current. When bias voltage is lower than threshold for a power cell, that power cell is turned off. As a result, the active of periphery of driver stage power device is reduced.

Block 412 consists of an array of power device cells. Each cell has individual bias trace from block 416 and can be feed with different bias voltage and current. Each cell connects with a capacitor of capacitor array block 410. When bias voltage is lower than threshold for a power cell, that power cell is turned off. As a result, the active of periphery of power stage power device is reduced.

Block 404, 408 and 414 are switchable matching networks and consist of capacitors, inductors, switches, and/or resistors. Each switch connects a capacitor. When status of switches is changed, for example, some of these switches are turn off or on, the frequency response of matching network will be changed. To reduce periphery of switch and capacitor array, proper topology should be chose to cover wide range with minimum bits of controls.

Blocks 404, 406, 408, 414 and 416 are integrated into a single die, which is fabricated with high resistance CMOS SOI.

Blocks 410 and 412 are integrated into a single die, which is fabricated with GaAs.

Figure 5:
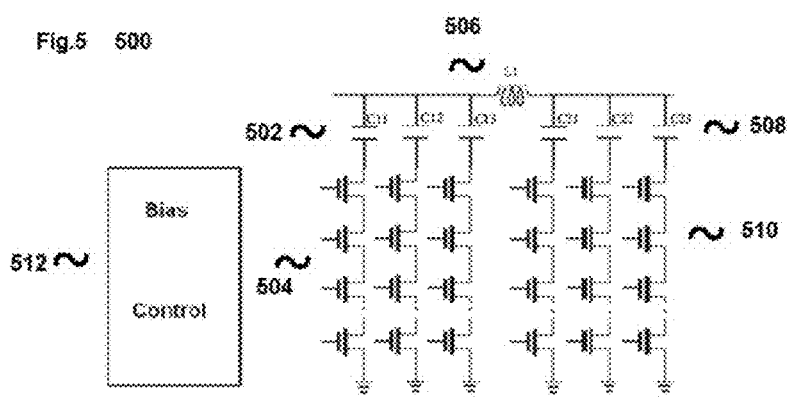
FIG. 5 is a schematic representation of a tunable matching network in the power amplifier according to one embodiment of the present invention.

FIG. 5 illustrates a topology and schematic for a switchable matching network block 404,408 and 414 for an exemplary embodiment of the RF PA 400. It comprises two shunt branch and one serial branch. Each shunt branch consists of an array of switches and capacitors. Each capacitor, such as 502 and 508, connects stacked FETs. Each FET has individual bias control from bias and control block 512, which is a part of 416 in FIG. 4. Inductor 506 is the only element in the serial branch.

Many advantages may accrue to embodiments of an RF PA as defined in accordance with this description. For example, integrated circuit area can be reduced while technology is scaling down. Another example, a switchable output matching network may used for adjustment to antenna impedance changes; Yet further, the individual control of biasing in amplifier blocks may be employed to improve the linearity of the overall amplification, particularly by biasing power device cells in 406 and 412 at different power levels. The architecture provides the possibility of extraordinary control and adjustment by means of processing decisions taken on the RF PA or by means of processing decision made in an associated device such as the processing circuitry of a cellular telephone.

The transistors in stacked-transistor RF switches as described herein are, in one embodiment, of an insulated-gate type, or are biased so as to conduct no DC gate current. In some embodiments, the transistors comprise FETs, particularly those referred to as MOSFETs, although that includes many FETs that are not fabricated with traditional Metal Oxide/Semiconductor layers, as was once implied by the name. The FETs have been described as if they comprise N polarity (NMOS), but they could equally comprise PMOS, or mixture of both types. Embodiments may employ non-preferred transistors, though they may require circuit adjustments to accommodate control-node DC currents.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A RF PA configured to amplify an RF signal between a source node RFIN and an output node RFOUT in a selectable plurality of frequency bands and wireless communication standards, the PA comprising:
 a) a driver stage power device configured as a first amplification stage; and
 b) a power stage power device configured as a last amplification stage;
 c) an input matching network in the front of the driver stage power device;

d) an inter-stage matching network between the driver stage power device and the power stage power device; and e) an output matching network after a power stage power device, wherein the driver stage power device is fabricated over a SOI integrated circuit die and comprises a plurality of parallel cells, wherein the power stage power device is fabricated over a GaAs die and comprises a plurality of parallel cells, such that the RF PA is configured to operate in multi-bands and multi-modes, and wherein the input matching network, the inter-stage matching network, and at least a portion of the output matching network are fabricated over the SOI integrated circuit die and comprise a plurality of switches adapted to reconfigure the RF PA for different bands and modes.

2. The RF PA of claim 1, wherein the driver stage power device further comprises power device cells is independently adjusted cell by cell with bias voltage and current from bias and control circuitry.

3. The RF PA of claim 1, wherein the power stage power device further comprises power device cells is independently adjusted cell by cell with bias voltage and current from bias and control circuitry.

4. The RF PA of claim 1, wherein the input matching network further comprises capacitors and switches, and wherein a capacitance is adjusted by switches.

5. The RF PA of claim 1, wherein the inter-stage matching network further comprises capacitors and switches, and wherein a capacitance is adjusted by switches.

6. The RF PA of claim 1, wherein the output matching network further comprises capacitors and switches, wherein a capacitance is adjusted by switches.

7. The RF PA of claim 1, wherein the input matching network, inter-stage matching network, a part of output matching network and driver stage power device are integrated into a single die.

8. The RF PA of claim 1, wherein the power stage power is integrated into a single die.

9. The RF PA of claim 1, wherein there is only one signal path from the input node to the output node.

10. The RF PA of claim 1, wherein the driver stage power device and the power stage power device are formed over a multiple-layer laminate.

11. The RF PA of claim 1, wherein each of the plurality of parallel cells of the power stage power device is coupled to a serial capacitor and biased with a separate trace from a bias control block.

12. The RF PA of claim 11, wherein each of the plurality of switches comprises one or more stacked FETs coupled to the serial capacitor.

13. The RF PA of claim 1, wherein the input matching networks, the inter-stage matching networks, and the inter-stage matching networks each comprise a plurality of switches.

14. The RF PA of claim 1, wherein each power cell has a base coupled to a capacitor.

15. A wireless communication system comprising a radio frequency (RF) power amplifier (PA), wherein the RF PA is configured to amplify an RF signal between a source node RFIN and an output node RFOUT in a selectable plurality of frequency bands and wireless communication standards, the PA comprising:

a) a driver stage power device configured as a first amplification stage; and b) a power stage power device configured as a last amplification stage;

c) an input matching network in the front of the driver stage power device;

d) an inter-stage matching network between the driver stage power device and the power stage power device; and e) an output matching network after a power stage power device, wherein the driver stage power device is fabricated over a SOI integrated circuit die and comprises a plurality of parallel cells, wherein the power stage power device is fabricated over a GaAs die and comprises a plurality of parallel cells, such that the RF PA is configured to operate in multi-bands and multi-modes, and wherein the input matching network, the inter-stage matching network, and at least a portion of the output matching network are fabricated over the SOI integrated circuit die and comprise a plurality of switches adapted to reconfigure the RF PA for different bands and modes.

16. The wireless communication system of claim 15, wherein the driver stage power device further comprises power device cells is independently adjusted cell by cell with bias voltage and current from bias and control circuitry.

17. The wireless communication system of claim 15, wherein the power stage power device further comprises power device cells is independently adjusted cell by cell with bias voltage and current from bias and control circuitry.

18. The wireless communication system of claim 15, wherein the input matching network further comprises capacitors and switches, and wherein a capacitance is adjusted by switches between bias and control circuitry.

19. The wireless communication system of claim 15, wherein the inter-stage matching network further comprises capacitors and switches, and wherein a capacitance is adjusted by switches between bias and control circuitry.

20. The wireless communication system of claim 15, wherein there is only one signal path from the input node to the output node.

* * * * *